United States Patent
Tsuruoka et al.

(10) Patent No.: US 10,121,800 B2
(45) Date of Patent: Nov. 6, 2018

(54) DISPLAY DEVICE INCLUDING A SUBSTRATE WITH REGIONS OF DIFFERENT HARDNESS

(71) Applicant: Japan Display Inc., Tokyo (JP)

(72) Inventors: Kazuto Tsuruoka, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 45 days.

(21) Appl. No.: 15/146,221

(22) Filed: May 4, 2016

(65) Prior Publication Data

US 2016/0336537 A1    Nov. 17, 2016

(30) Foreign Application Priority Data

May 14, 2015    (JP) ................. 2015-099396

(51) Int. Cl.
*H01L 27/12*    (2006.01)
*H01L 51/00*    (2006.01)

(52) U.S. Cl.
CPC ...... *H01L 27/1218* (2013.01); *H01L 51/0097* (2013.01); *H01L 2251/5338* (2013.01); *Y02E 10/549* (2013.01); *Y02P 70/521* (2015.11)

(58) Field of Classification Search
CPC ............. H01L 51/0097; H01L 27/1218; H01L 27/3251; H01L 2251/5338
See application file for complete search history.

(56) References Cited

U.S. PATENT DOCUMENTS

| | | | |
|---|---|---|---|
| 9,516,743 B2* | 12/2016 | Kim | H05K 1/028 |
| 2003/0047280 A1* | 3/2003 | Takayama | B32B 7/06 156/708 |
| 2004/0179165 A1* | 9/2004 | Kinoshita | G02F 1/133305 349/158 |
| 2013/0088662 A1* | 4/2013 | Watanabe | G02F 1/133308 349/58 |
| 2014/0159046 A1 | 6/2014 | Wei et al. | |

FOREIGN PATENT DOCUMENTS

| | | |
|---|---|---|
| JP | 2011-016708 A | 1/2011 |
| JP | 2011-073446 A | 4/2011 |
| JP | 2013-157228 A | 8/2013 |
| WO | 2011/155117 A1 | 12/2011 |

OTHER PUBLICATIONS

Japanese Office Action dated Sep. 18, 2018 for the corresponding Japanese Patent Application No. 2015-099396, with partial machine translation.

\* cited by examiner

*Primary Examiner* — Daniel Luke
(74) *Attorney, Agent, or Firm* — Typha IP LLC

(57) ABSTRACT

A display device is provided including a substrate having a first region and a second region, a plurality of pixels above the first region, and a connection terminal above the second region, wherein a Young's modulus of the second region is higher than a Young's modulus of the first region.

16 Claims, 29 Drawing Sheets

(b)

132  104  103

DISPLAY DEVICE INCLUDING A SUBSTRATE WITH REGIONS OF DIFFERENT HARDNESS

CROSS REFERENCE TO RELATED APPLICATIONS

This application is based upon and claims the benefit of priority from the Japanese Patent Application No. 2015-099396, filed on May 14, 2015, the entire contents of which are incorporated herein by reference.

FIELD

The present invention is related to a display device. In particular, the present invention is related to a structure of a substrate in a flexible display device.

BACKGROUND

An organic electroluminescence (referred to herein as organic EL) display device is arranged with a light-emitting element in each pixel and displays an image by individually controlling the light emission. A light-emitting element includes a structure in which a layer (referred to herein as ) including an organic EL material is sandwiched between a pair of electrodes regarded as an anode electrode and cathode electrode. The organic EL display device is arranged with one electrode as a pixel electrode in each pixel and the other electrode as a common electrode which extends over a plurality of pixels and is applied with a common voltage. The organic EL display device controls the light emitted by a pixel by applying the voltage of the pixel electrode to each pixel with respect to the voltage of the common electrode.

In particular, a flexible display device which uses a substrate comprised from a thin polyimide (PI) resin and the like is being actively developed. In the manufacture of a flexible display device, a substrate (TFT side substrate) formed with a tin film transistor circuit element and light-emitting element in sequence is prepared above a resin such as a PI film or the like formed above a support substrate such as a glass substrate and the like. A substrate with a color filter above a resin such as a PI film and the like (CF side substrate) formed above a separate support substrate is prepared. A flexible display device including a thin PI resin substrate is obtained by bonding these substrates together, peeling both support substrates and dicing into separate pieces.

Here, since a PI resin substrate is very thin with a thickness of 10~20 μm, it is effective to supplementary bond a film which protects the PI resin substrate with the aim of preventing deformation in a manufacturing process.

However, when a PI resin substrate deforms particularly in a peeling process of a support substrate or after peeling process, it becomes difficult to bond a film for protecting the PI resin substrate in subsequent processes which is a cause of a drop in manufacturing yield.

A structure is disclosed in Japanese Laid Open Patent No. 2013-157228 for example in which a formation protective layer is bonded to a substrate via adhesive layer or adhesion layer in order to prevent warping or distortions of the substrate in an organic EL device.

SUMMARY

One embodiment of the present invention is a display device including a substrate having a first region and a second region, a plurality of pixels above the first region, and a connection terminal above the second region, wherein a Young's modulus of the second region is higher than a Young's modulus of the first region, or the second region is harder than the first region.

One embodiment of the present invention is a method for manufacturing display device including forming a substrate on a support substrate, the substrate has a first region and a second region and a Young's modulus of the second region is higher than a Young's modulus of the first region, forming a plurality of pixels above the first region of the substrate, forming a connection terminal above the second region of the substrate, and removing the substrate and the support substrate.

DESCRIPTION OF THE EMBODIMENTS

The embodiments of the present invention are explained below while referring to the diagrams. However, it is possible to perform the present invention using various different forms, and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. Furthermore, in the specification and each drawing, the same reference symbols are attached to similar elements and elements that have been mentioned in previous drawings, and therefore a detailed explanation may be omitted where appropriate.

In the present specification, in the case where certain parts or regions are given as other parts or regions, as long as there is no particular limitation, these include parts which are not only directly above (or directly below) other parts or regions but also in an upper direction (or lower direction), that is, other structure elements may be included between other parts or regions in an upper direction (or lower direction).

<First Embodiment>

Figure 1:
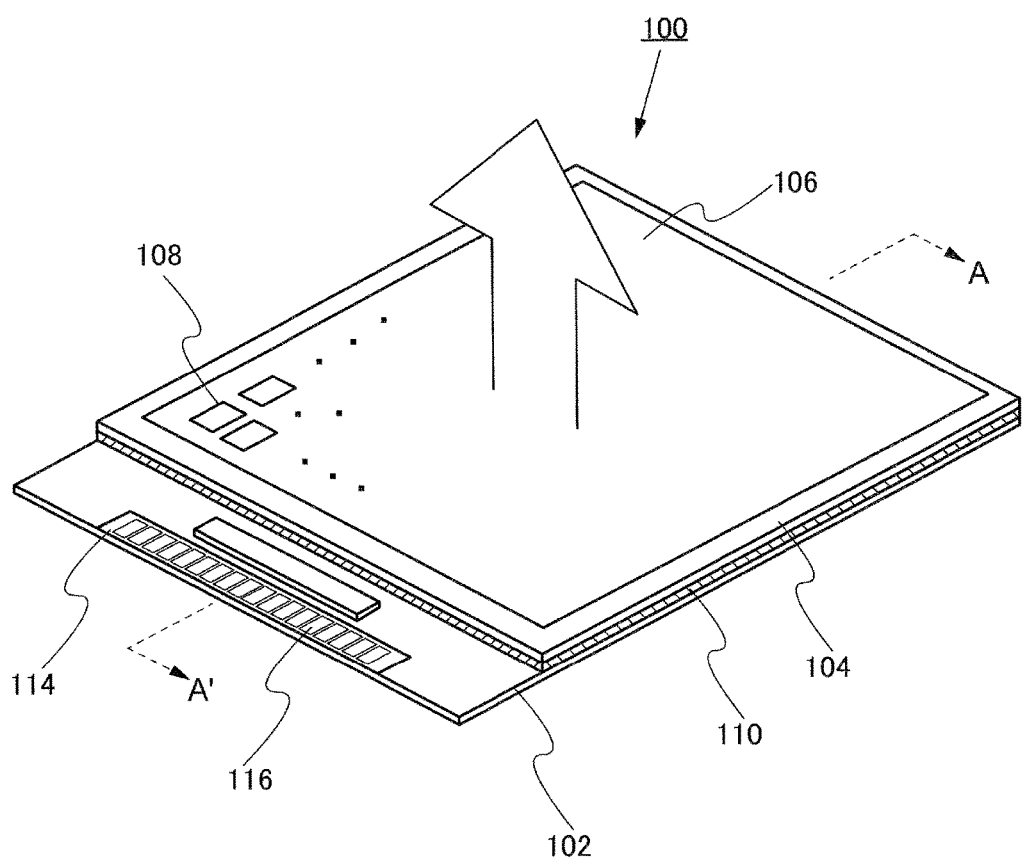
FIG. 1 is a perspective view diagram showing a structure of a display device according to one embodiment of the present embodiment.

The structure of a display device 100 according to the present embodiment is explained while referring to FIG. 1. FIG. 1 is a perspective view diagram showing the structure of the display device 100 according to the present embodiment. The display device 100 is arranged with a display region 106 in a first substrate 102. The display region 106 is formed by arranging a plurality of pixels 108. A second substrate 104 is arranged on the upper surface of the display region 106 as a sealing component. The second substrate 104 is fixed to the first substrate 102 by a sealing material 110 which encloses the display region 106. The display region 106 formed in the first substrate 102 is sealed so as not be exposed to air by the second substrate 104 which is a sealing component and the sealing material 110. Degradation of a light-emitting element arranged in a pixel 108 is suppressed by this sealing structure.

A terminal region 114 is arranged on an end part of the first substrate 102. The terminal region 114 is arranged on the outer side of the second substrate 104. The terminal region 114 is formed by a plurality of connection terminals 116. A wiring substrate which connects devices which output a video signal or power supply and a display panel is arranged in the connection terminal 116. The connection point of the connection terminal 116 which connects with the wiring substrate is exposed to the exterior.

Figure 2:
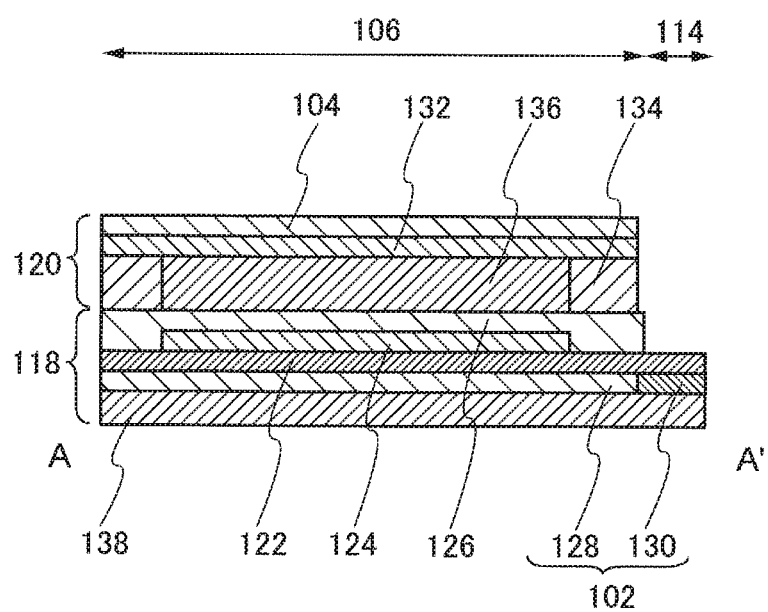
FIG. 2 is a perspective view diagram showing a structure of a display device according to one embodiment of the present embodiment.

The structure of the display device 100 according to the present embodiment is further explained in detail while referring to the diagrams. FIG. 2 is a cross-sectional diagram showing the structure of the display device 100 according to the present embodiment and shows a cross-section along the line A-A' in FIG. 1.

The display device 100 according to the present embodiment has a structure in which a TFT side substrate 118 formed with a thin film transistor circuit element and a light-emitting element, and a OF side substrate 120 formed with a color filter (OF) are bonded together.

First, the TFT side substrate is explained. The TFT side substrate 118 includes a first substrate 102 having flexibility and a TFT layer 122, light-emitting layer 124 and sealing layer 126 are arranged above the first substrate 102. Furthermore, a protective film 138 may also be arranged on a surface on the opposite side to the CF side substrate 120 of the first substrate 102. The protective film 138 is a resin film or organic film formed from a resin material comprised from polyimide (PI) for example or an organic material.

The first substrate 102 includes a first region 128 and a second region 130. In a subsequent process, a plurality of pixels 108 are formed in the first region 128 and a connection terminal 116 is formed in the second region 130. That is, the first region 128 is a region corresponding to a display region 106 for displaying an image. The second region 130 is a region which includes a terminal region 114. In addition, the second region 130 can be said to be the region excluding the first region 128 above the first substrate 102.

In the present embodiment, a Young's modulus in the second region 130 of the first substrate 102 having flexibility is higher than a Young's modulus in the first region 128.

A Young's modulus is a proportional constant of strain and stress in both axial directions in an elasticity range where Hooke's Law is applicable. In other words, it is an index which indicates rigidity of a substance. That is, in the present embodiment, it can be said that the second region 130 of the first substrate 102 is harder than the first region 128.

In the display device 100 according to the present embodiment, the Young's modulus of the first region 138 of the first substrate 102 is 3 GPa or more and 6 GPa or less for example, and the Young's modulus of a flexible substrate in a conventional flexible display device is almost included within this numerical range. In addition, the Young's modulus of the second region 130 of the first substrate 102 is preferred to be 8 GPa or more and 9 GPa or less.

By providing the first substrate 102 with this type of structure, it is possible to suppress the generation of deformations or wrinkles in the first substrate 102 which easily occur in particular in the terminal region 114 of the first substrate 102 during a manufacturing process, and thereby suppress a drop in manufacturing yield.

When the Young's modulus of the second region 130 of the first substrate 102 is lower than the numerical range described above, the possibility that terminal region 114 of the first substrate 102 increases in the manufacturing process and manufacturing yield drops. On the other hand, when the Young's modulus of the second region 130 is higher than the numerical range described above, the flexibility of the first region 128 decreases and the usefulness of a flexible display device drops.

It is preferred that the Young's modulus of the second region 130 is 1.5 times or more and 3 times or less than the Young's modulus of the first region 128 as the relationship between the Young's modulus of the first region 128 and the Young's modulus of the second region 130 of the first substrate 102.

It is possible to use an organic resin for example as the material of the first substrate 102 having flexibility. It is possible to use polyimide (PI) for example as the organic resin. In the present embodiment, PI is used as the first substrate 102. At this time, the film thickness of the first substrate 102 can be set to around 10 µm or more and 20 µm or less.

The composition of PI makes it possible to prepare a substrate with a Young's modulus in the range of 3 GPa or more and 9 MGPa or less. That is, a first PI 102a and a second PI 102b which have a Young's modulus in the numerical range described above can be respectively used as the material for the first region 128 and second region 130 of the first substrate 102.

A TFT layer 122 is arranged above the first substrate 102. The TFT layer 122 is used in a pixel circuit for displaying an image and includes a thin film transistor (TFT) not shown in the diagram, and wire.

The light-emitting element 124 is arranged in the display region 106 in which displays an image. The light-emitting element 124 includes a structure in which a pixel electrode arranged in each pixel 108 and a common electrode arranged across a plurality of pixels 108 sandwich a light-emitting layer (not shown in the diagram). A low molecular or high molecular organic material can be used for the light-emitting element 124 in the case where an organic EL layer is used as the light-emitting layer. In the case where a low molecular organic material is used, in addition to the light-emitting layer including an organic material with light emitting properties, a structure including a hole injection layer or electron injection layer, or a hole transport layer or electron transport layer which sandwich the light-emitting layer is possible. In the present embodiment, the light-emitting layer uses a component that emits white light and full color is realized using a color filter. In addition, the light-emitting layer may also be formed across a plurality of pixels 108 and may also be formed independently in each of a plurality of pixels 108.

The sealing layer 126 is arranged above the light-emitting element 124 and also formed so as to planarize irregularities due to the light-emitting element 124. The sealing layer 126 is preferred to be an insulation layer which can block the infiltration of moisture to the light-emitting element 124. It is possible to use an inorganic insulation layer or an organic insulation layer as the insulation layer. Alternatively, a stacked structure is possible in which these layers are combined.

Next, the CF side substrate 120 is explained. The CF side substrate 120 is arranged with a color filter (CF) layer 132, sealing material 134 and filler material 136b above the second substrate 104 which has flexibility for example. Furthermore, the CF side substrate 130 may also be the second substrate 104 arranged with at least the color filter (CF) layer 132, the first substrate 102 and second substrate 104 may be bonded together using the sealing material 132 and the filler material 136 may be filled between the first substrate 102 and second substrate 104.

The CF layer 132 is arranged in a region corresponding to the display region 106 above the second substrate 104 and is arranged with color filters of the three colors R(red), G(green) and B(blue), and a light-blocking layer (also called a black matrix) which sections a color filter of each color (not shown in the diagram). Light leaking between pixels is blocked by arranged the light-blocking layer and display defects such as mixing of each color are prevented.

The sealing material 134 is arranged so as to enclose a region corresponding to the display region 106. The filler material 136 is arranged in a region enclosed by the sealing material 134.

The first substrate 102 and second substrate 104 are bonded together using the sealing material 134. The light-emitting element 124 formed in the display region 106 is sealed by the filler material 136 and sealing material 134 so as not to be exposed to air. Degradation of the light-emitting element 124 is suppressed by this type of sealing structure. It is possible to use a material including a transparent epoxy resin for example as the filler material 136.

The structure of the display device 1000 according to the present embodiment was explained above. The display device 100 according to the present embodiment can suppress the generation of deformations or wrinkles in the first substrate 102 which easily occur in particular in the terminal region 114 of the first substrate 102 during a manufacturing process, and thereby suppress a drop in manufacturing yield.

[Manufacturing Method]

Next, a manufacturing method of the display device 100 according to the present invention is explained in detail while referring to the diagrams. FIG. 3A to FIG. 6H are diagrams for explaining a manufacturing method of the display device 100 according to the present invention. FIG. 3A to FIG. 4C are diagrams for explaining a manufacturing process of the TFT side substrate 128. FIG. 5A to FIG. 5D are diagrams for explaining a manufacturing process of the CF side substrate 130. FIG. 6A to FIG. 6H are diagrams for explaining the processes subsequent to the process of bonding the TFT side substrate 128 and CF side substrate 130.

First, a manufacturing process of the TFT side substrate is explained while referring to FIG. 3A to FIG. 4C.

First, the support substrate 101 is prepared. A glass substrate may be used for example as the support substrate 101.

Figure 3A:
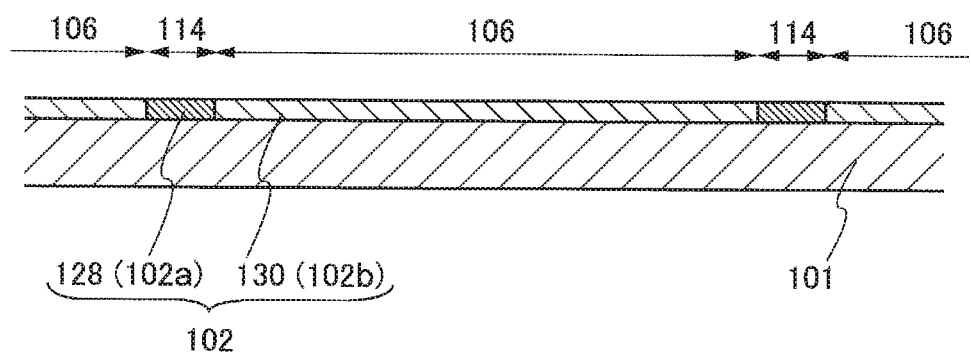
FIG. 3A is a cross-sectional diagram for explaining a manufacturing method of a display device according to one embodiment of the present embodiment.
Figure 3B:
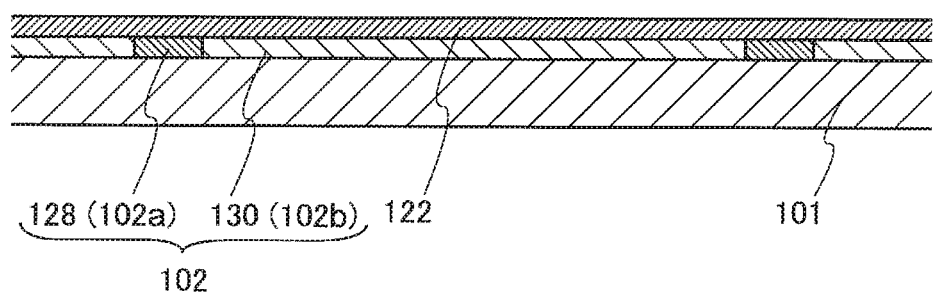
FIG. 3B is a cross-sectional diagram for explaining a manufacturing method of a display device according to one embodiment of the present embodiment.
Figure 3C:
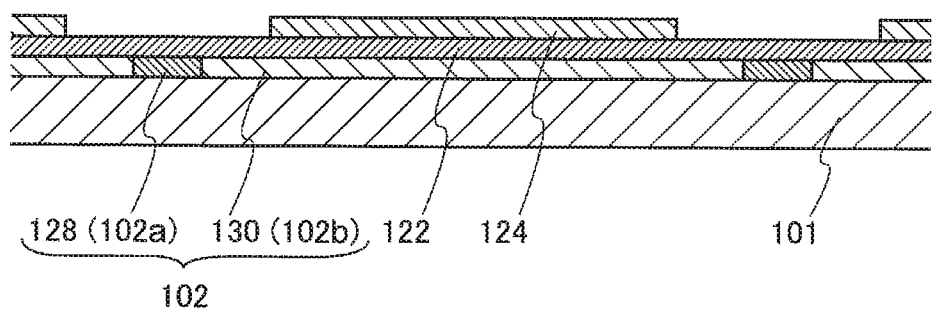
FIG. 3C is a cross-sectional diagram for explaining a manufacturing method of a display device according to one embodiment of the present embodiment.
Figure 3D:
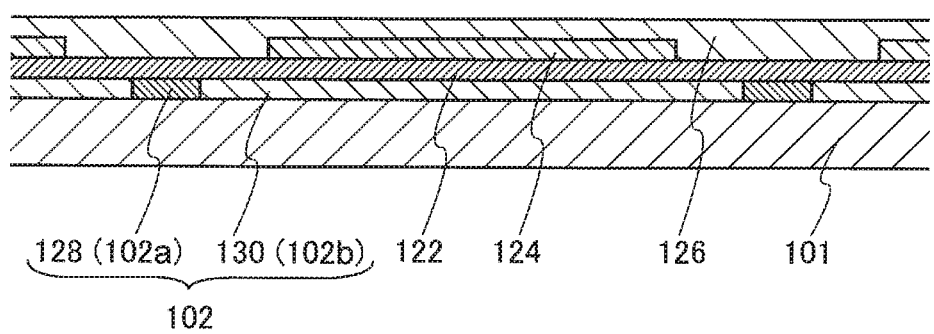
FIG. 3D is a cross-sectional diagram for explaining a manufacturing method of a display device according to one embodiment of the present embodiment.

The first substrate 102 is formed above the support substrate 101 (FIG. 3A). The first substrate 102 includes the first region 128 and second region 130, and materials having a different Young's modulus are selectively arranged in each region respectively. The materials having a different Young's modulus may be organic materials for examples. Two types of PI having different Young's modulus are used in the present embodiment. That is, a first PI 102a is arranged in the first region 128 and a second PI 102b is arranged in the second region 130.

Figure 4A:
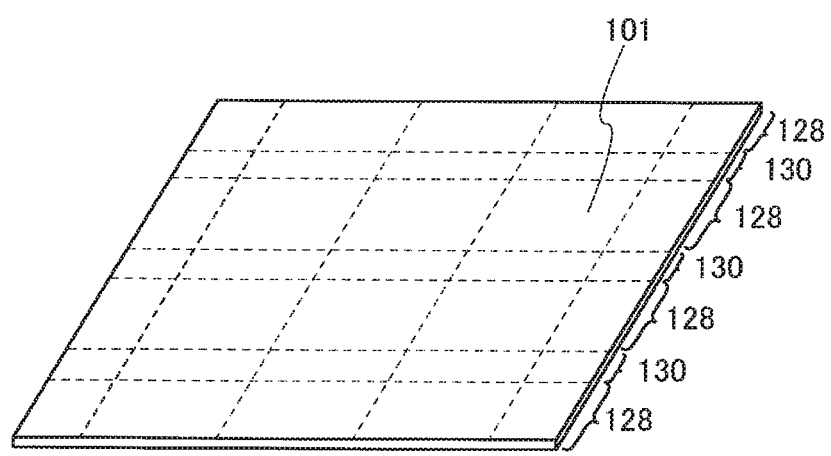
FIG. 4A is a cross-sectional diagram for explaining a manufacturing method of a display device according to one embodiment of the present embodiment.
Figure 4B:
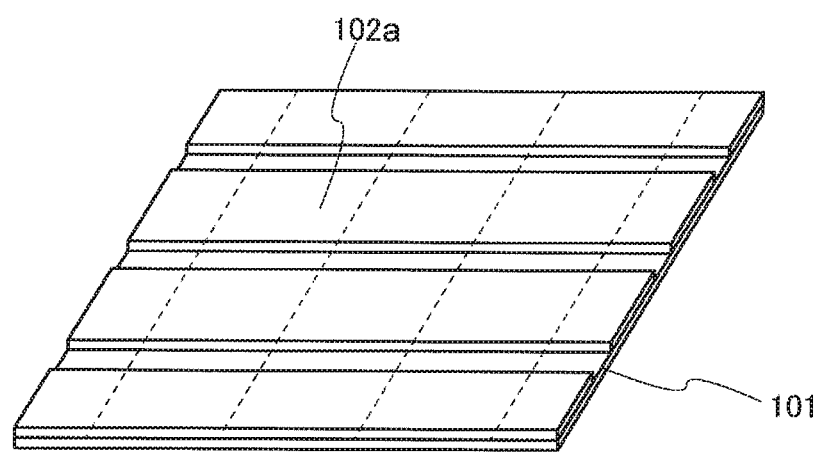
FIG. 4B is a cross-sectional diagram for explaining a manufacturing method of a display device according to one embodiment of the present embodiment.
Figure 4C:
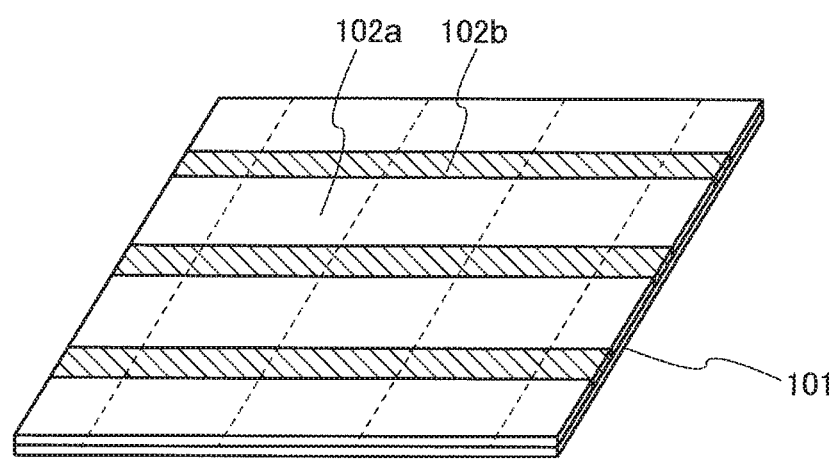
FIG. 4C is a cross-sectional diagram for explaining a manufacturing method of a display device according to one embodiment of the present embodiment.

In particular, a detailed manufacturing method of the first substrate 102 is explained using FIG. 4A to FIG. 4C. FIG. 4A to FIG. 4C are perspective diagrams showing a manufacturing method of the first substrate 102. FIG. 4A is a step of preparing the support substrate 101 which is a glass substrate in the present embodiment.

Next, he first PI 102a is formed in a region which becomes the first region 128 (FIG. 4B). It is possible to use a printing method or photolithography method and the like as the method for forming the PI 102a.

As an example, the first PI 102a may be formed only in a region which becomes the first region 128 using a printing method such as an inkjet method for example.

As another example, the first PI 102a may be formed only in a region which becomes the first region 128 using a film formation method for forming a thin film through a mask. This method is a film formation method in which a mask arranged with an aperture part is aligned on a surface of a substrate on which the film is formed. and film formation and patterning is performed through the aperture part. At this time, the mask may be adhered to the surface of a substrate or arranged with a clearance between the substrate and the mask.

As a further example, the first PI 102a may be formed on the entire surface of the support substrate 101, the first PI 102a on the first region 128 may be left and the first PI 102a on the second region 130 may be removed by using photolithography method.

Next, the second PI 102b is selectively formed in a region which becomes the second region 130 (FIG. 4C). The second region 130 may be a region except the first region 128 in the first substrate 102. It is possible to use a printing method or photolithography method and the like as the method for forming the second PI 102b.

As an example, the second PI 102b may be formed only in a region which becomes the second region 130 using a printing method such as an inkjet method for example.

As another example, the second PI 102b may be formed only in a region which becomes the second region 130 using a film formation method for forming a thin film through the mask described above.

As a further example, the second PI 102b may be formed on the entire surface of the support substrate 101, the second PI 102b on the second region 120 may be left and the second PI 102b on the first region 128 may be removed by using photolithography method.

Furthermore, although a process for forming the second PI 102b after forming the first PI 102a was explained above, the sequence for forming these may also be reversed.

Furthermore, it is preferred that the Young's modulus of the second region 130 in the display device 100 according to the present embodiment is higher than the Young's modulus of the first region 128. Therefore, in the manufacturing process described above, the first PI 102a formed across the second region 130 does not have to be removed by etching in a subsequent process. That is, a structure is possible in which the first PI 102a and second PI 102b are stacked in the second region 130.

Next, the TFT layer 122 (FIG. 3B) is formed above the first substrate 102, the light-emitting element 124 (FIG. 3C) is formed above the TFT layer 122 and the sealing layer 126 (FIG. 3D) is formed above the light-emitting element 124 to obtain the TFT side substrate 118.

Next, the manufacturing process of the CF side substrate 130 is explained while referring to FIG. 5A to FIG. 5D. First, a support substrate 103 is prepared. A glass substrate for example may be used as the support substrate 103.

Figure 5A:
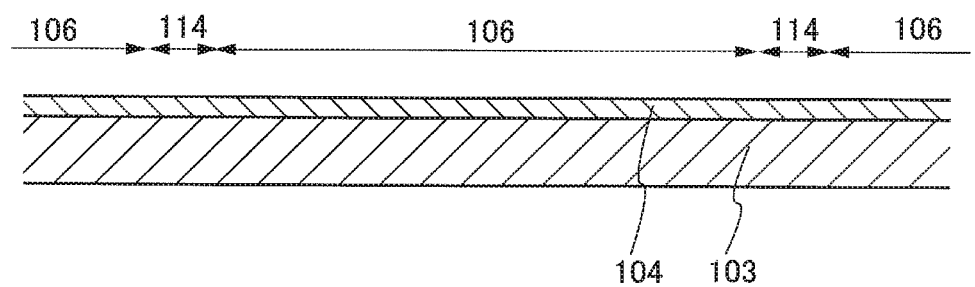
FIG. 5A is a cross-sectional diagram for explaining a manufacturing method of a display device according to one embodiment of the present embodiment.

The second substrate 104 is formed above the support substrate 103 (FIG. 5A). The second substrate 104 may be formed on the entire surface of the support substrate 103. In the present embodiment, PI is used as the second substrate 104.

Figure 5B:
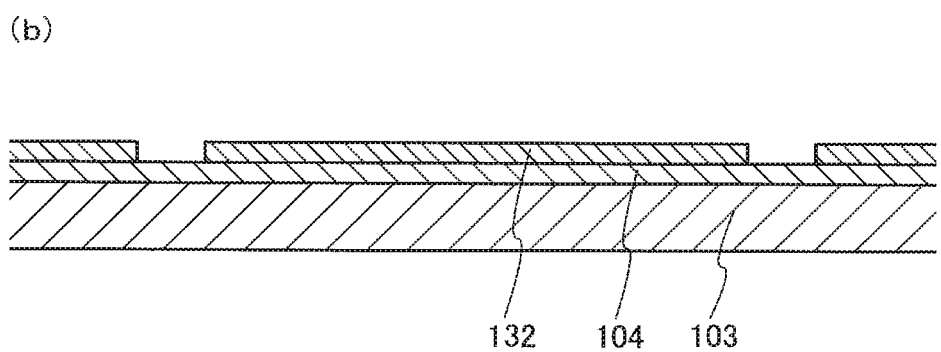
FIG. 5B is a cross-sectional diagram for explaining a manufacturing method of a display device according to one embodiment of the present embodiment.
Figure 5C:
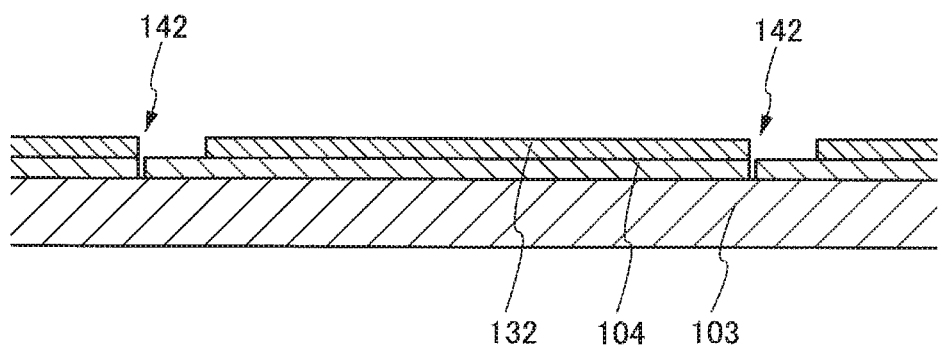
FIG. 5C is a cross-sectional diagram for explaining a manufacturing method of a display device according to one embodiment of the present embodiment.

Next, the CF layer 132 is formed in a region corresponding to the display region 106 above the second substrate 104 (FIG. 5B). The CF layer 132 is arranged in a region corresponding to the display region 106 above the second substrate 104 and includes a light-blocking layer which sections color filters of each color R(red), G(green) and B(blue) (not shown in the diagram).

Next, a separation trench 142 which separates the second substrate 104 into the display region 106 and terminal region 114 is formed in each display device. The separation trench 142 can be formed using photolithography.

Figure 5D:
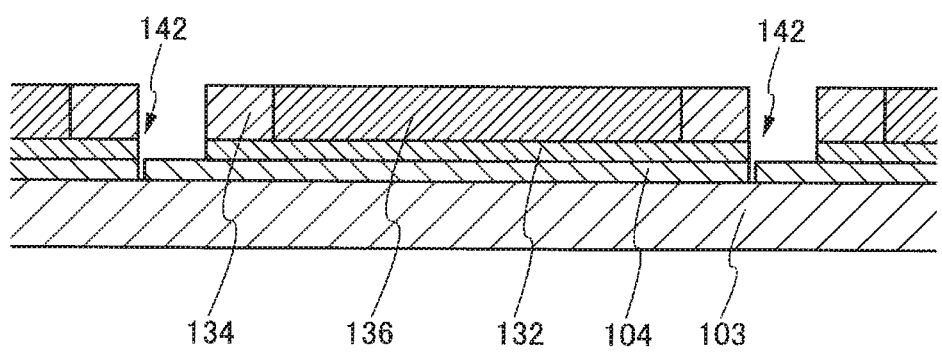
FIG. 5D is a cross-sectional diagram for explaining a manufacturing method of a display device according to one embodiment of the present embodiment.

Next, the sealing material 134 is arranged so as to enclose a region corresponding to the display region 106 and the filler material 136 is arranged in a region enclosed by the sealing material 134 to obtain the CF side substrate 120 (FIG. 5D). The manufacturing method of the CF side substrate 120 was explained above. Furthermore, the sealing material 134 and filler material 136 may also be arranged in the TFT side substrate 118.

Next, the processes after the process of bonding together the TFT side substrate 118 and CF side substrate 120 are explained while referring to FIG. 6A to FIG. 6H.

Figure 6A:
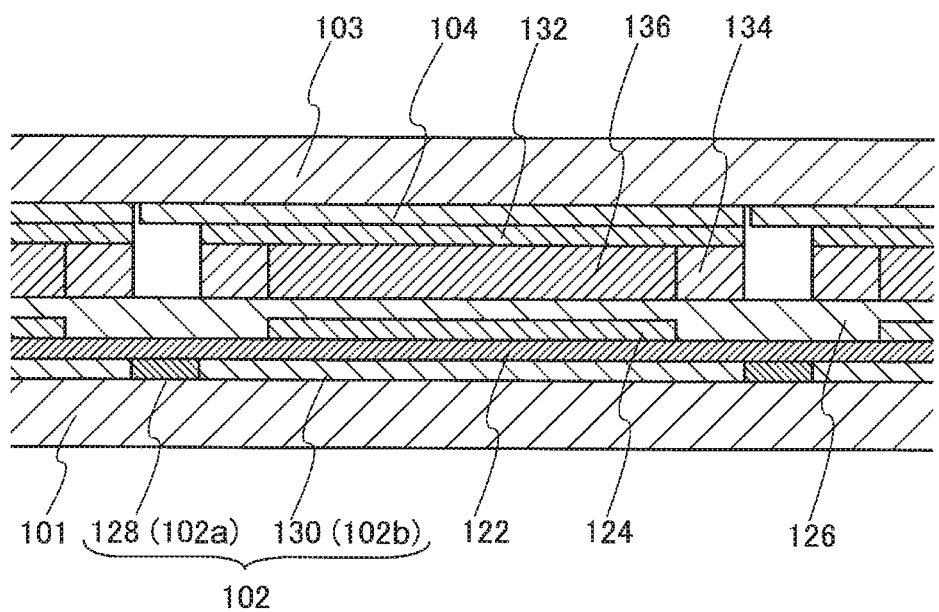
FIG. 6A is a cross-sectional diagram for explaining a manufacturing method of a display device according to one embodiment of the present embodiment.

The TFT side substrate 118 and CF side substrate 120 prepared in the processes described previously are positioned to face each other, aligned and bonded together (FIG. 6A).

Figure 6B:
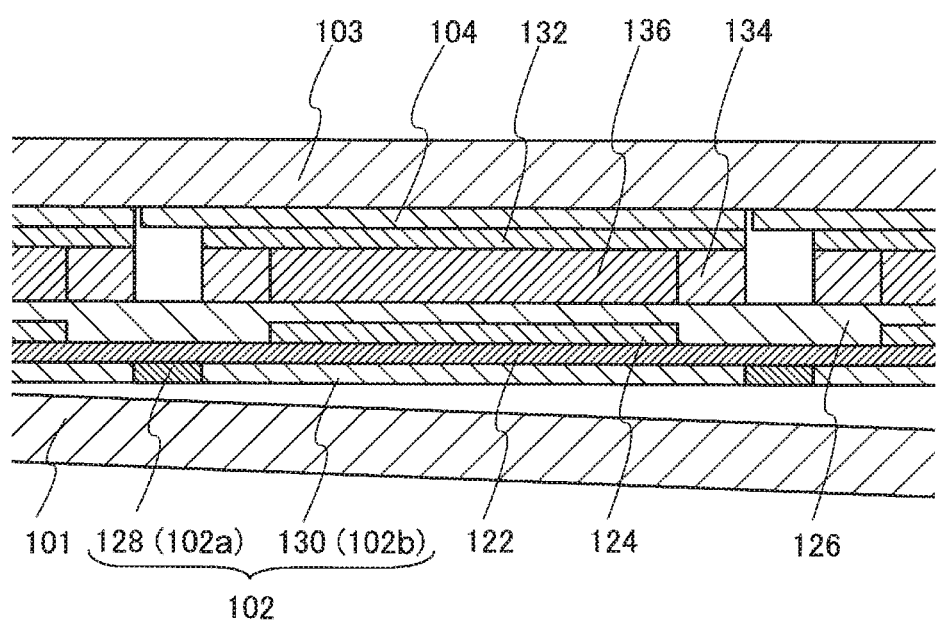
FIG. 6B is a cross-sectional diagram for explaining a manufacturing method of a display device according to one embodiment of the present embodiment.

Next, the TFT side support substrate 101 is peeled from the first substrate 102 (FIG. 6B). In this way, among the surfaces of the first substrate 102, the surface on the opposite side of the surface opposing second substrate 104, which does not display an image, becomes exposed to the exterior.

Here, a problem is explained in which there is concern in a peeling process of the support substrate 101 and first substrate 102 in a conventional example. In this peeling process, in the case where PI with a uniform Young's modulus is used and not PI which has a different Young's modulus in the first region 128 and second region 130 respectively like present embodiment, wrinkle shaped irregularities and distortions easily occur for example in the second region 130 in particular of the first substrate corresponding to the terminal region 114.

Before peeling of the support substrate 101, the display region 106 is fixed when the support substrate 101 and second substrate 104 are opposing each other via sealing material 134 and filler material 136. On the other hand, since there is a gap between the support substrate 101 and second substrate 104, in other words, since the terminal region 1134 does not overlap the second substrate 104 seen in a planar view, there is no element which supports the first substrate 102 in the terminal region 114. Therefore, the problem described above easily occurs.

In response to this type of problem, according to the manufacturing method of the display device according to the present embodiment, since a PI having a comparatively high Young's modulus, that is, a comparatively hard PI, is used in the second region 130 corresponding to the terminal region 114 of the first substrate 102, the deformations described above hardly occur. Although described in detail in an explanation of a subsequent process, in this way it is possible to suppress a drop in manufacturing yield due to the occurrence of deformations, warping and wrinkles of the first substrate 102.

Figure 6C:
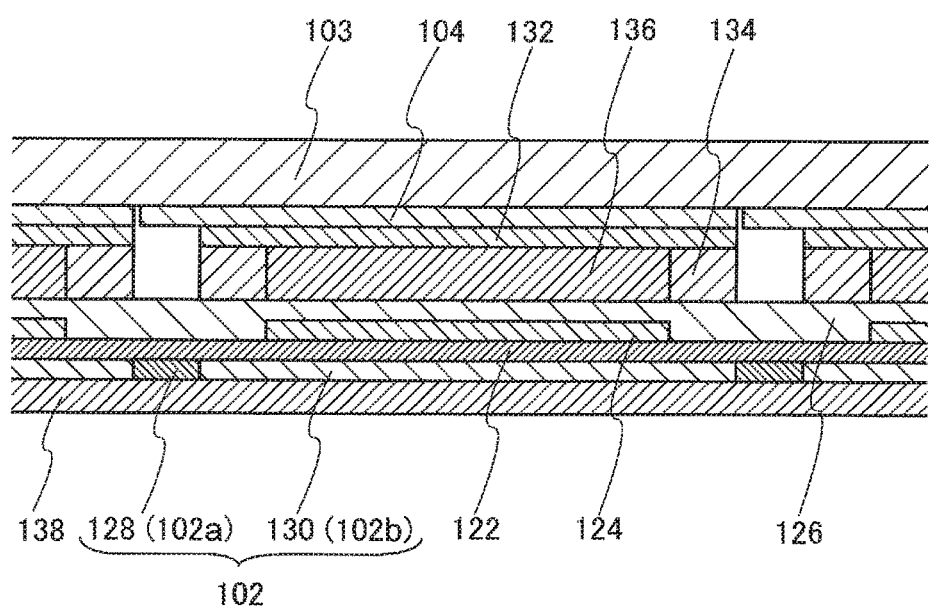
FIG. 6C is a cross-sectional diagram for explaining a manufacturing method of a display device according to one embodiment of the present embodiment.

Next, a protection film 13 is bonded to the non-display surface side of the first substrate 102 (FIG. 6C). Since the first substrate 102 is very thin with a thickness of 10~20 µm, it is effective to supplementary bond the protection film 138 which protects the first substrate 10 with the aim of preventing deformation in a manufacturing process.

Here, when the first substrate 102 deforms due to a peeling process of the support substrate 101 and has irregularities, sufficient adhesion of the protection film 138 cannot be secured and it becomes difficult to stably bond the film. As a result, these peel for example in a subsequent process, the first substrate 102 is not sufficiently protected and manufacturing yield drops In response to this problem, in the present embodiment, since deformations of the first substrate 102 hardly occur for the reasons described above, it is possible to secure sufficient adhesion with the protection film 138 and bonding becomes easy. In this way, it is possible to sufficiently protect the first substrate 102 in a subsequent process and suppress a drop in manufacturing yield.

Figure 6D:
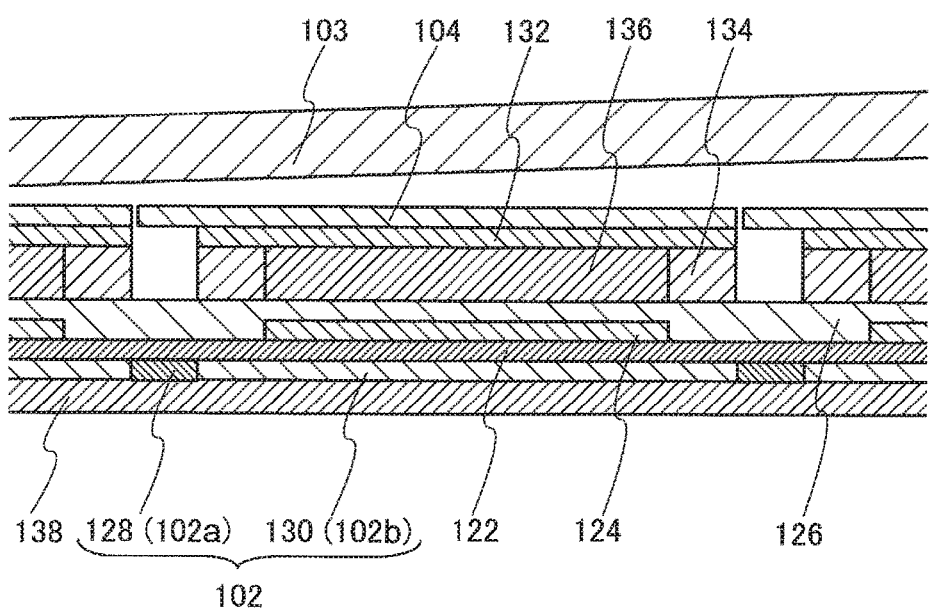
FIG. 6D is a cross-sectional diagram for explaining a manufacturing method of a display device according to one embodiment of the present embodiment.

Next, the CF side support substrate 104 is peeled (FIG. 6D).

Figure 6E:
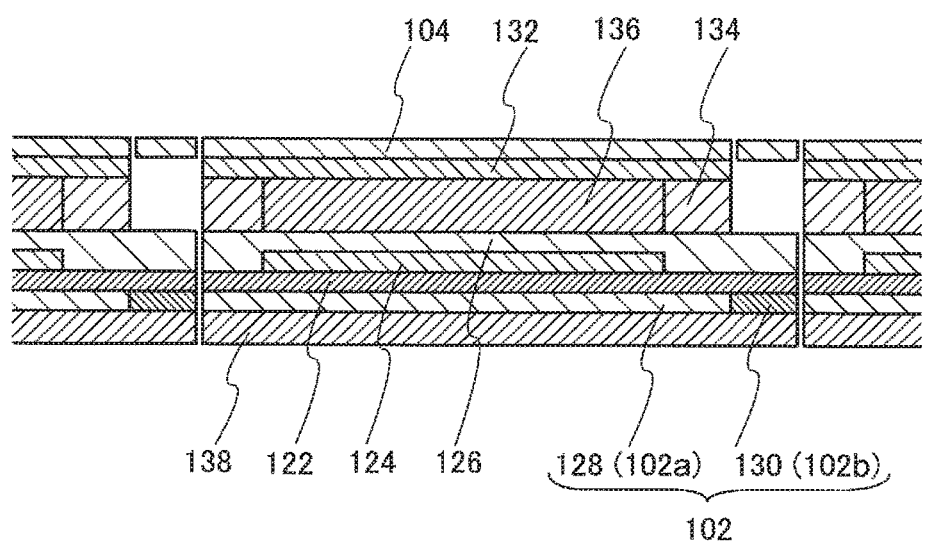
FIG. 6E is a cross-sectional diagram for explaining a manufacturing method of a display device according to one embodiment of the present embodiment.

Next, a plurality of display devices formed above the same support substrate is separated and each is cut into pieces respectively (FIG. 6E).

Figure 6F:
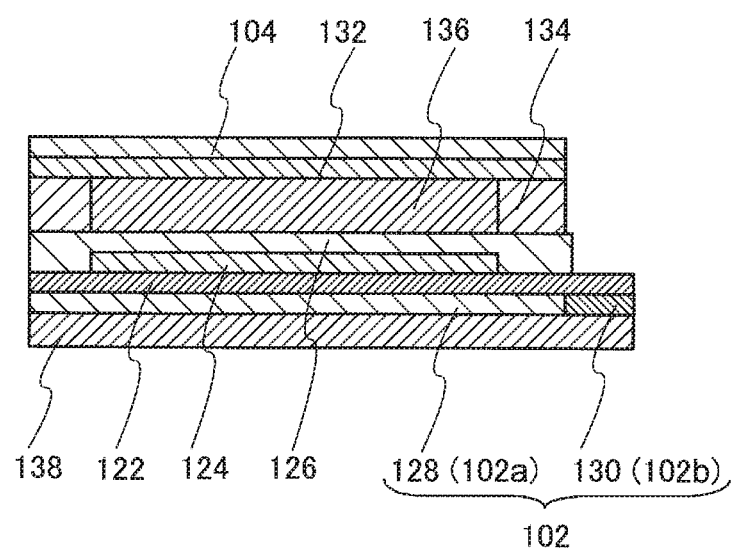
FIG. 6F is a cross-sectional diagram for explaining a manufacturing method of a display device according to one embodiment of the present embodiment.
Figure 6G:
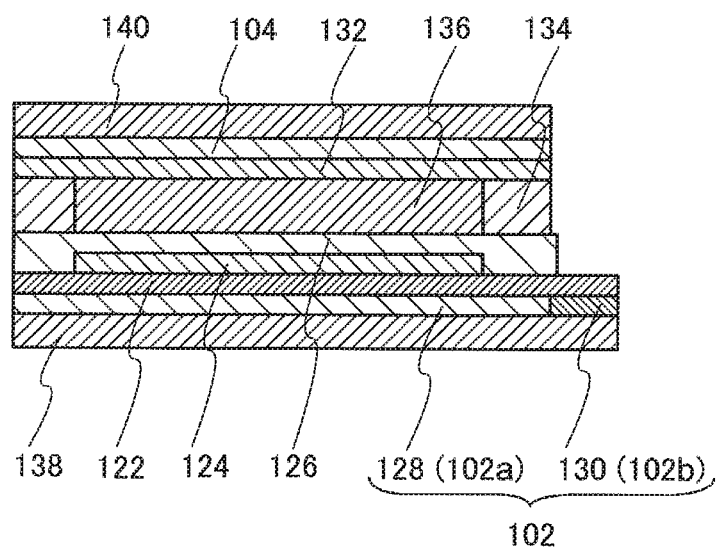
FIG. 6G is a cross-sectional diagram for explaining a manufacturing method of a display device according to one embodiment of the present embodiment.

Next, a connection terminal 116 is exposed in the terminal region 114 (FIG. 6F). Furthermore, the connection terminal 116 is included in the TFT layer 122 in FIG. 6F. It is possible to obtain the display device 100 according to the present embodiment via the processes described above Here, as shown in FIG. 6G, a protection film 140 may be arranged on the side. In this way, it is possible to improve physical and mechanical strength of a display device. It is possible to select whether to arrange the protection film 140 on the CF side according to the form of the final product.

Figure 6H:
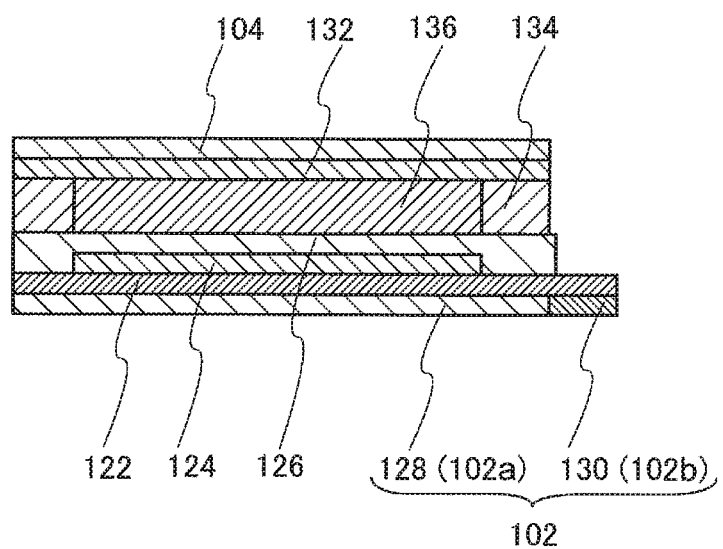
FIG. 6H is a cross-sectional diagram for explaining a manufacturing method of a display device according to one embodiment of the present embodiment.

In addition, as shown in FIG. 6H, the TFT side protection film 138 may be peeled. It is possible to select whether to peel the protection film 140 on the TFT side according to the form of the final product.

The manufacturing method of the display device 100 according to the present embodiment was explained above. According to the manufacturing method of the display device 100 according to the present embodiment, it is possible to suppress deformation of the first substrate 102 which becomes a problem during the manufacturing process. In particular, it is possible to suppress irregularities which occur in the terminal region 114 when peeling the TFT side support substrate 101. In this way, bonding of the protection film 138 to the first substrate 102 becomes easier a subsequent manufacturing process and it is possible to improve manufacturing yield.

<Second Embodiment>

The structure of a display device 200 according to the present embodiment is explained in detail while referring to the diagrams. The appearance and structure of the display device 200 according to the present embodiment is the same as the display device 100 according to the first embodiment.

When the display device 200 according to the present embodiment and the display device 100 according to the first embodiment are compared, in the manufacturing method, only the method of forming the first substrate 102 is different.

Figure 7A:
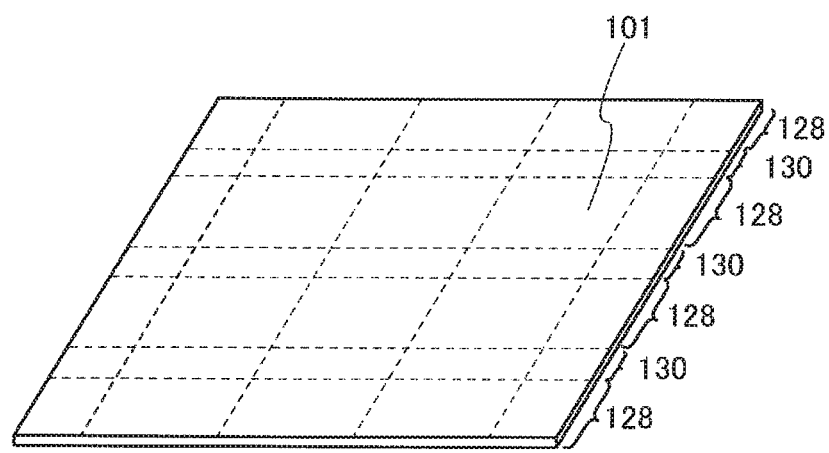
FIG. 7A is a perspective view diagram for explaining a manufacturing method of a display device according to one embodiment of the present embodiment.
Figure 7B:
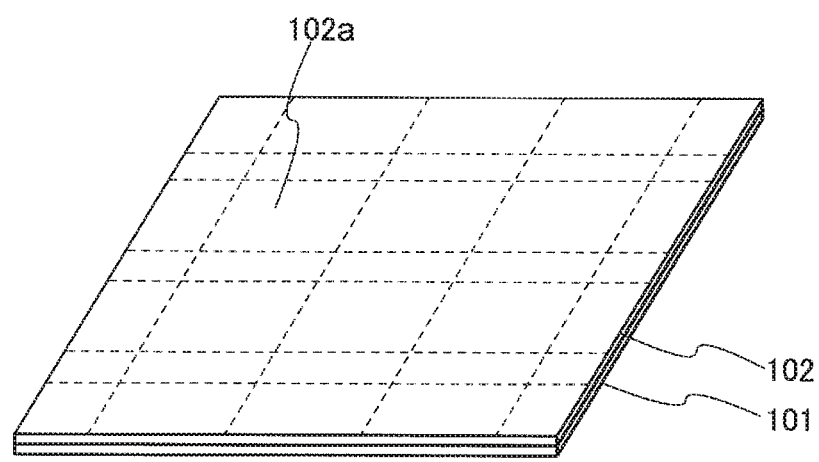
FIG. 7B is a perspective view diagram for explaining a manufacturing method of a display device according to one embodiment of the present embodiment.
Figure 7C:
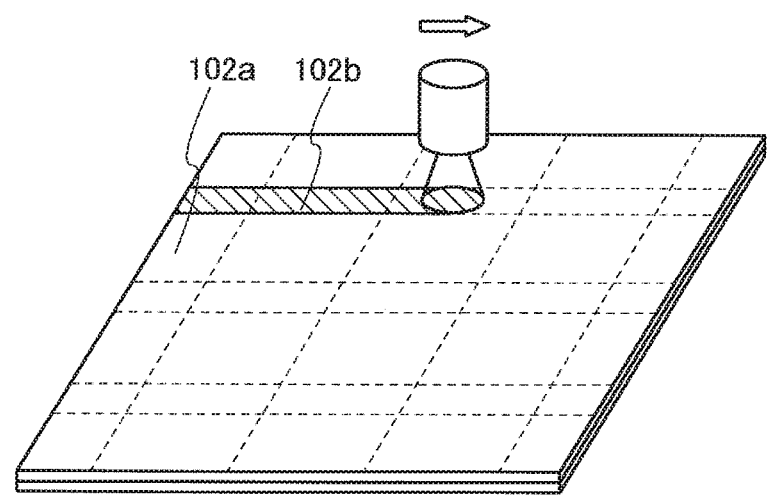
FIG. 7C is a perspective view diagram for explaining a manufacturing method of a display device according to one embodiment of the present embodiment.

The manufacturing method of the first substrate 102 of the display device 200 according to the present embodiment is explained using FIG. 7A to FIG. 7C.

FIG. 7A to FIG. 7C are perspective diagrams showing a manufacturing method of the first substrate 102. FIG. 7A is a support substrate 101 which is a glass substrate in the present embodiment.

Next, the first substrate 102 is formed across a region in which the first region 128 and second region 130 are arranged (FIG. 7B). The first substrate 102 may also be formed on the entire surface of the support substrate 101. In the present embodiment the first substrate 102 is PI.

Next, energy irradiation is performed on the second region 130 of the first substrate 102 and PI in the second region 130 is cured (FIG. 7C). Ultra violet irradiation for example can be used for the energy irradiation. In this way, PI in the second region 130 which is irradiated with energy becomes harder than PI in the first region 128. That is, the Young's modulus of PI in the second region 130 becomes higher than the Young's modulus of PI in the first region 128.

In this way, since it is possible to form PI having a comparatively high Young's modulus in the second region 130 corresponding to the terminal region 114 of the first substrate 102, deformations in the terminal region hardly occur in a subsequent manufacturing process. In this way, it is possible to suppress a drop in manufacturing yield due to deformation of the first substrate 102.

Furthermore, if this type of manufacturing method of the first substrate 102 is used, since a photolithography process is not used, it is possible to easily prepare the display device according to the present embodiment without an increase in the number of masks required for manufacture.

<Third Embodiment>

Figure 8:
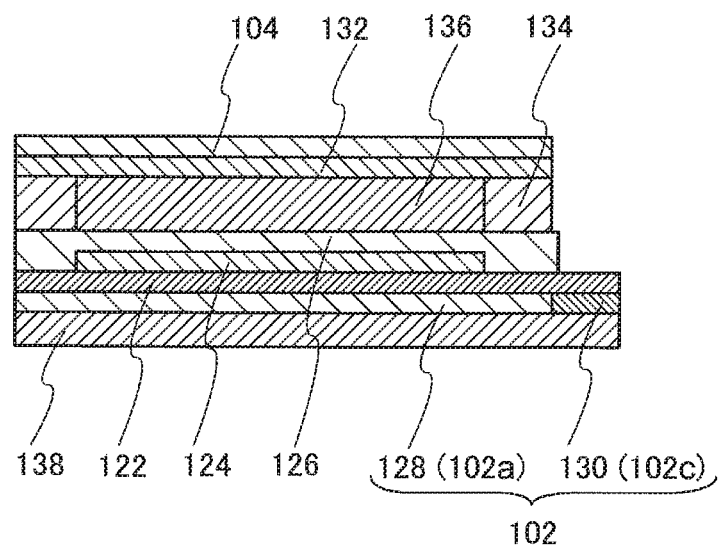
FIG. 8 is a cross-sectional diagram showing a structure of a display device according to one embodiment of the present embodiment.

The structure of a display device 300 according to the present embodiment is explained in detail while referring to the diagrams. The appearance and structure of the display device 300 according to the present embodiment is the same as the display device 100 according to the first embodiment. FIG. 8 is a cross-sectional diagram for explaining the structure of the display device 300 according to the present embodiment.

When the structure of the display device 300 according to the present embodiment is compared with the structure of the display device 100 according to the first embodiment, only the material of the second region 130 is different. In the present embodiment, a material other than PI is used as the material 102c of the second region 130 of the first substrate 102. It is possible to use a material having a higher Young's modulus than the material of the first region 128 as the material of the second region 130. For example, it is possible to use an inorganic material or an organic material. It is possible to use a ceramic material for example as an inorganic material. It is possible to use an epoxy resin or polyimide resin for example as an organic material.

By providing the first substrate 102 with this type of structure as a support substrate, it is possible to suppress deformations which occur easily in the terminal region 114 in particular of the first substrate 102 during the manufacturing process and it is possible to suppress a drop in manufacturing yield.

Since the manufacturing method of the display device 300 in the present embodiment is the same as the manufacturing method of the display device 100 in the first embodiment, and only the material of the second region 130 of the first substrate 102 is different, a detailed explanation is omitted.

<Fourth Embodiment>

In the display device according to the first to third embodiments, the layout of the first region 128 and second region 130 in the first substrate 102 is common. That is, the second region 130 arranged with the connection terminal 116 is arranged along one edge of the first substrate 102. However, the present invention is not limited to this type of layout.

Figure 9:
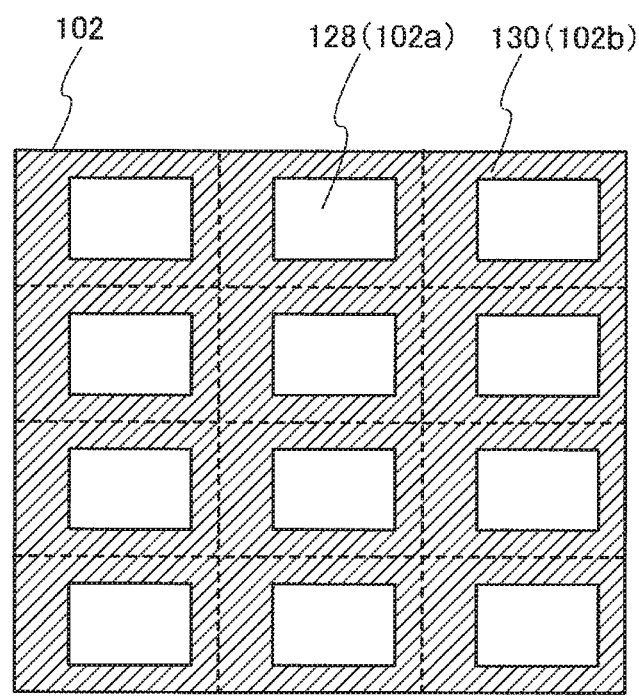
FIG. 9 is a planar view diagram showing a structure of a display device according to one embodiment of the present embodiment.

Other preferred embodiments of the first region 128 and second region 130 are explained while referring to the diagrams. FIG. 9 is a diagram for explaining the layout of the first region 128 and second region 130 in the first substrate 102 of a display device 400 according to the present embodiment. In FIG. 9, an upper surface view is shown before each display device is cut into separate pieces. In this example, when each of the plurality of display devices arranged in the support substrate 101 is focused on, the second region 130 is arranged so as to enclose the first region 128. In other words, the second region 130 is arranged along the periphery edge of each display device.

By providing this type of structure, since the entire display device is enclosed by the second region 130 having a higher Young's modulus than the first region 128, it is more difficult for deformations to occur during the manufacturing process.

In this way, it is possible to omit the TFT side protection film 138 arranged for preventing deformations during the manufacturing process. Furthermore, it is possible to omit the TFT side protection film 138 and/or CF side protection film in the final product. In this way, this leads to a simplification of manufacturing processes and a reduction in manufacturing costs.

<Fifth Embodiment>

In the display device according to the first to fourth embodiments, the first substrate 102 has a structure comprised from only one layer. However, the structure of the first substrate 102 is not limited to this and may be formed by stacking a plurality of films. In the present embodiment, a preferred form in which the first substrate 102 is stacked with a plurality of films is explained.

Figure 10A:
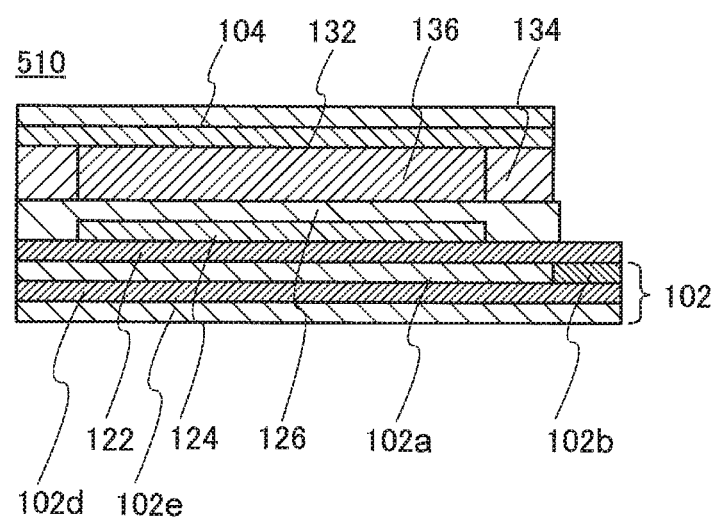
FIG. 10A is a cross-sectional diagram showing a structure of a display device according to one embodiment of the present embodiment.
Figure 10B:
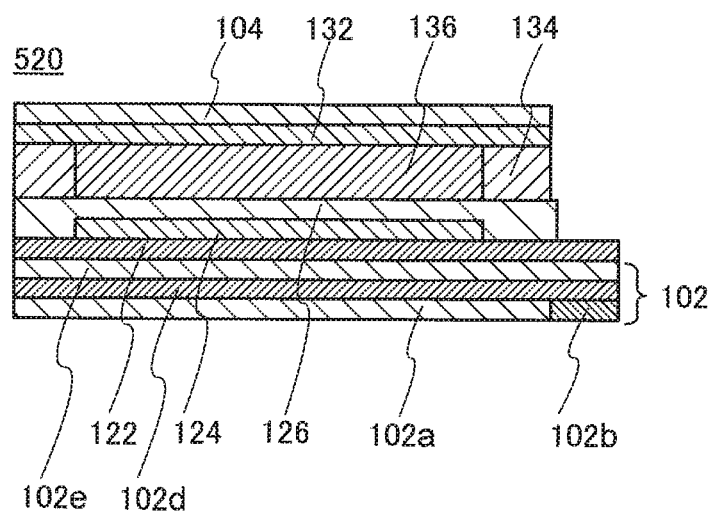
FIG. 10B is a cross-sectional diagram showing a structure of a display device according to one embodiment of the present embodiment.
Figure 10C:
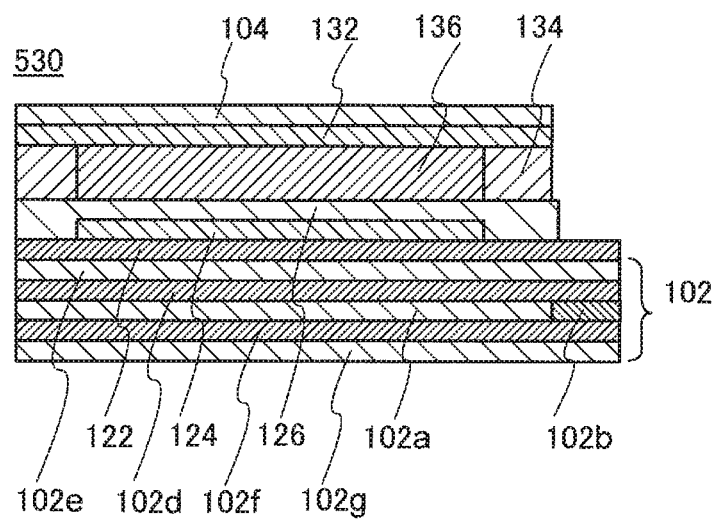
FIG. 10C is a cross-sectional diagram showing a structure of a display device according to one embodiment of the present embodiment.

FIG. 10A to FIG. 10C are diagrams showing three examples of a display device including the first substrate 102 having a stacked layer structure. FIG. 10A shows a display device 510 having a three layer stacked structure as the first substrate 102. Among these, the films 102a and 102b closest to the second substrate 104 side are the same as the first substrate 102 shown in either of the first to third embodiments, and a region having a different Young's modulus is arranged. The film 102d adjacent below the films 102a and 102b is a film including an inorganic material. It is possible to use silicon oxide or silicon nitride for example as the inorganic material. A film 102e adjacent below the film 102d is an organic material. It is possible to use PI for example as the organic material. The planar structure of the film 102e is uniform. That is, a material is arranged uniformly.

FIG. 10B shows a display device 520 having a three layer stacked structure as the first substrate 102. Among these, the film 102e closest to the second substrate 104 side is an organic material. It is possible to use PI for example as the organic material. The planar structure of the film 102e is uniform. It is possible to use silicon oxide or silicon nitride for example as the inorganic material. A film 102d adjacent below the film 102e is a film including an inorganic material. It is possible to use silicon oxide or silicon nitride for example as the inorganic material. The films 102a and 102b adjacent below the film 102d are the same as the first substrate 102 shown in either of the first to third embodiments. FIG. 10C shows a display device 530 including a five layer structure as the first substrate 102. The three layers on the second substrate 103 side have the same structure as the display device 520 shown in FIG. 10B. A film 102(f) below the three layers described above is a film including an inorganic material. It is possible to use silicon oxide or silicon nitride for example as the inorganic material. A film 102(g) adjacent below the film 102(f) is an organic material. It is possible to use PI for example as the organic material. The planar structure of the film 102(g) is uniform.

By providing this type of stacked layer structure, barrier properties of the first substrate are improved and infiltration of foreign materials such as water into the display device from the exterior is suppressed. In this way, it is possible to provide the display devices 510 to 530 with improved reliability.

In addition, the first substrate 102 is formed above the support substrate 101 in the manufacturing process and the support substrate 101 is peeled in a subsequent process. In the peeling process, among the first substrate 102 contacting the support substrate 101, it is preferred that the lowest layer film has a uniform planar structure. That is, in the examples described above, the structure of the first substrate 102 shown in FIG. 10A and FIG. 10C is preferred.

Furthermore, the present invention is not limited to the examples shown above and various stacked layer structures can be selected. In addition, although all of the examples shown above show the first substrate 102 with a stacked layer structure, the second substrate 104 may also be provided with a stacked layer structure. In this way, barrier properties of the second substrate 104 are improved and infiltration of foreign materials such as water into the display device from the exterior is suppressed. In this way, it is possible to provide a display device with improved reliability.

The preferred embodiments of the present invention were explained above using the first to ninth embodiments. However, these embodiments are merely examples and the technical scope of the present invention is not limited to these embodiments. A person ordinarily skilled in the art could make various modifications without departing from the concept of the present invention. Therefore, such modifications should also be interpreted as belonging to the technical scope of the present invention.

What is claimed is:

1. A display device comprising:
   a substrate having a first region and a second region, a plurality of pixels above the first region, and a connection terminal above the second region;
   wherein
   the first region includes a first material,
   the second region includes a second material that is in physical contact with the first material,
   the second material does not overlap the first material in a planar view, and
   a Young's modulus of the second material is higher than a Young's modulus of the first material.

2. The display device according to claim 1, wherein the substrate includes an organic material.

3. The display device according to claim 2, wherein the organic material is polyimide.

4. The display device according to claim 1, wherein the second region of the substrate includes an inorganic material.

5. The display device according to claim 1, wherein the Young's modulus of the first region is 3 GPa or more and 6 GPa or less.

6. The display device according to claim 1, wherein the Young's modulus of the second region is 1.5 times or more and 3 times or less the Young's modulus of the first region.

7. The display device according to claim 1, wherein the second region surrounds the first region.

8. The display device according to claim 1, wherein a protection film is arranged on an opposite side of the substrate from the plurality of pixels.

9. A display device comprising:
a first substrate having flexible properties;
a plurality of pixels formed above the first substrate; and
a connection terminal formed above the first substrate, wherein
the first substrate has a first region overlapping at least the plurality of pixels and a second region overlapping at least the connection terminal,
the first region includes a first material,
the second region includes a second material that is in physical contact with the first material,
the second material does not overlap the first material in a planar view, and
the second material is harder than the first material.

10. The display device according to claim 9 further comprising: a second substrate opposing the first substrate; wherein
the first region overlaps the second substrate and the second region does not overlap the second substrate.

11. The display device according to claim 9, wherein the first region includes a first polyimide and the second region includes a second polyimide harder than the first polyimide.

12. The display device according to claim 9, wherein the first region includes an organic material and the second region includes an inorganic material.

13. The display device according to claim 9,
wherein the first substrate includes a first organic film extending from the first region to the second region continuously,
a first inorganic film extending from the first region to the second region continuously,
a second organic film arranged in the first region, overlapping the first organic film and the first inorganic film, and being in contact with the first inorganic film,
a third organic film arranged in the second region, overlapping the first organic film and the first inorganic film, and being in contact with the first inorganic film,
wherein the third organic film is harder than the second organic film.

14. The display device according to claim 9,
wherein the first substrate includes a first organic film extending from the first region to the second region continuously,
a first inorganic film extending from the first region to the second region continuously,
a second organic film arranged in the first region, overlapping the first organic film and the first inorganic film, and being in contact with the first inorganic film,
a second inorganic film arranged in the second region, overlapping the first organic film and the first inorganic film, and being in contact with the first inorganic film,
wherein the second inorganic film is harder than the second organic film.

15. The display device according to claim 13,
wherein a surface of the first substrate is the first organic film, the surface being an opposite side to the plurality of pixels.

16. The display device according to claim 9,
wherein the second region surrounds the first region.

* * * * *